(12) United States Patent
Yu et al.

(10) Patent No.: US 10,978,118 B1
(45) Date of Patent: Apr. 13, 2021

(54) DDR SDRAM SIGNAL CALIBRATION DEVICE AND METHOD

(71) Applicant: REALTEK SEMICONDUCTOR CORPORATION, Hsinchu (TW)

(72) Inventors: Chun-Chi Yu, Hsinchu County (TW); Fu-Chin Tsai, Taipei (TW); Chih-Wei Chang, Hsinchu County (TW); Gerchih Chou, San Jose, CA (US)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/682,689

(22) Filed: Nov. 13, 2019

(51) Int. Cl.
| | |
|---|---|
| *G11C 7/22* | (2006.01) |
| *G11C 11/4076* | (2006.01) |
| *G11C 7/04* | (2006.01) |
| *G11C 11/4093* | (2006.01) |
| *G06F 3/06* | (2006.01) |

(52) U.S. Cl.
CPC ............ *G11C 7/222* (2013.01); *G06F 3/0644* (2013.01); *G11C 7/04* (2013.01); *G11C 11/4076* (2013.01); *G11C 11/4093* (2013.01); *G11C 2207/2254* (2013.01)

(58) Field of Classification Search
CPC ....... G11C 7/222; G11C 7/04; G11C 11/4076; G11C 11/406; G11C 11/4093; G11C 2207/2254
See application file for complete search history.

(56) References Cited

U.S. PATENT DOCUMENTS

| | | | | |
|---|---|---|---|---|
| 8,775,761 | B2 * | 7/2014 | Ok ........................ | G11C 7/1093 |
| | | | | 711/167 |
| 9,105,327 | B2 * | 8/2015 | Prakash ............... | G06F 13/1689 |
| 9,285,824 | B2 * | 3/2016 | Zhu ....................... | G06F 13/1689 |
| 10,320,591 | B2 * | 6/2019 | Giovannini ........... | G06F 3/0644 |
| 2015/0049562 | A1 * | 2/2015 | Yu ........................ | G06F 13/1689 |
| | | | | 365/193 |

OTHER PUBLICATIONS

Chun-Chi Yu et al. U.S. Appl. No. 16/177,603, filed Nov. 1, 2018.

* cited by examiner

*Primary Examiner* — Sultana Begum
(74) *Attorney, Agent, or Firm* — WPAT, PC

(57) ABSTRACT

Disclosed is a DDR SDRAM signal calibration device capable to adapting to the variation of voltage and/or temperature. The device includes: an enablement signal setting circuit configured to generate data strobe (DQS) enablement setting; a signal pad configured to output a DQS signal; a signal gating circuit configured to generate a DQS enablement setting signal and a DQS enablement signal according to the DQS enablement setting and then output a gated DQS signal according to the DQS enablement signal and the DQS signal; and a calibration circuit configured to output a calibration signal according to the DQS enablement setting signal and at least one of the DQS enablement signal and the DQS signal so that the enablement signal setting circuit can maintain or adjust the DQS enablement setting according to the calibration signal.

20 Claims, 13 Drawing Sheets

DDR SDRAM SIGNAL CALIBRATION DEVICE AND METHOD

BACKGROUND OF THE INVENTION

1. Field of the Invention

The present invention relates to a signal calibration device and method, especially to a DDR SDRAM signal calibration device and method capable of adapting to the variation of voltage and/or temperature.

2. Description of Related Art

Generally, when reading data of a Double Data Rate Synchronous Dynamic Random Access Memory (DDR SDRAM), the DDR SDRAM sends a data strobe (DQS) signal and a data (DQ) signal to a controller. The DQS signal includes a tristate, a preamble, and clocks. The tristate is the signal between a previous access operation and a current read operation; the preamble is used for reminding the controller of preparing to read the DQ signal according to the clocks; and the clocks follow the preamble. In order to have a sampling circuit properly sample the DQ signal according to the clocks of the DQS signal instead of the tristate of the DQS signal, the controller uses a duration of a data strobe enablement (DQS_EN) signal being at a specific level (e.g., high level) to include the start and end of the clocks of the DQS signal; preferably, the controller has the level of the DQS_EN signal change from an original level to the specific level at the middle position of the preamble of the DQS signal, and has the level of the DQS_EN signal return to the original level according to a read command received by the DDR SDRAM; accordingly, the duration of the DQS_EN signal being at the specific level can properly include the clocks of the DQS signal without including the tristate, and allows the sampling circuit to sample the DQ signal according to the right part of the DQS signal (i.e., the clocks of the DQS signal).

However, even though the position of the preamble of the DQS signal is found and used for correctly setting the timing of the level change of the DQS_EN signal, the position of the preamble will vary with the voltage and/or temperature. This is especially serious when reading data of a Low Power Double Data Rate Synchronous Dynamic Random Access Memory (LPDDR SDRAM) because the position variation of the preamble of the LPDDR SDRAM's DQS signal may exceed the length of this preamble; therefore, after the voltage and/or temperature change(s), the duration of the DQS_EN signal being at the specific level may not correctly include the clocks of the DQS signal so that the sampling circuit may sample the DQ signal too early according to a wrong trigger signal (e.g., the tristate) and obtain incorrect read data or the sampling circuit may sample the DQ signal too late and obtain incomplete read data.

SUMMARY OF THE INVENTION

An object of the present invention is to provide a DDR SDRAM signal calibration device and method capable of adapting to the variation of voltage and/or temperature.

An embodiment of the DDR SDRAM signal calibration device of the present invention includes an enablement signal setting circuit, a signal pad, a signal gating circuit, and a calibration circuit. The enablement signal setting circuit is configured to generate data strobe (DQS) enablement setting. The signal pad is configured to output a DQS signal. The signal gating circuit is coupled to the enablement signal setting circuit and the signal pad, and configured to generate a DQS enablement setting signal and a DQS enablement signal according to the DQS enablement setting and then output a gated DQS signal according to the DQS enablement signal and the DQS signal. The calibration circuit is coupled to the enablement signal setting circuit, and configured to output a calibration signal according to the DQS enablement setting signal and at least one of the DQS enablement signal and the DQS signal so that the enablement signal setting circuit is allowed to maintain or adjust the DQS enablement setting according to the calibration signal.

An embodiment of the DDR SDRAM signal calibration method of the present invention includes the following steps: generating a DQS enablement setting signal and a DQS enablement signal according to DQS enablement setting; outputting a gated DQS signal according to the DQS enablement signal and a DQS signal; and outputting a calibration signal according to the DQS enablement setting signal and at least one of the DQS enablement signal and the DQS signal, in which the calibration signal is used for maintaining or adjusting the DQS enablement setting.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present invention discloses a Double Data Rate Synchronous Dynamic Random Access Memory (DDR SDRAM) signal calibration device and method capable of adapting to the variation of voltage and/or temperature. This invention is particularly important for reading data of a Low Power Double Data Rate Synchronous Dynamic Random Access Memory (LPDDR SDRAM).

Figure 1:
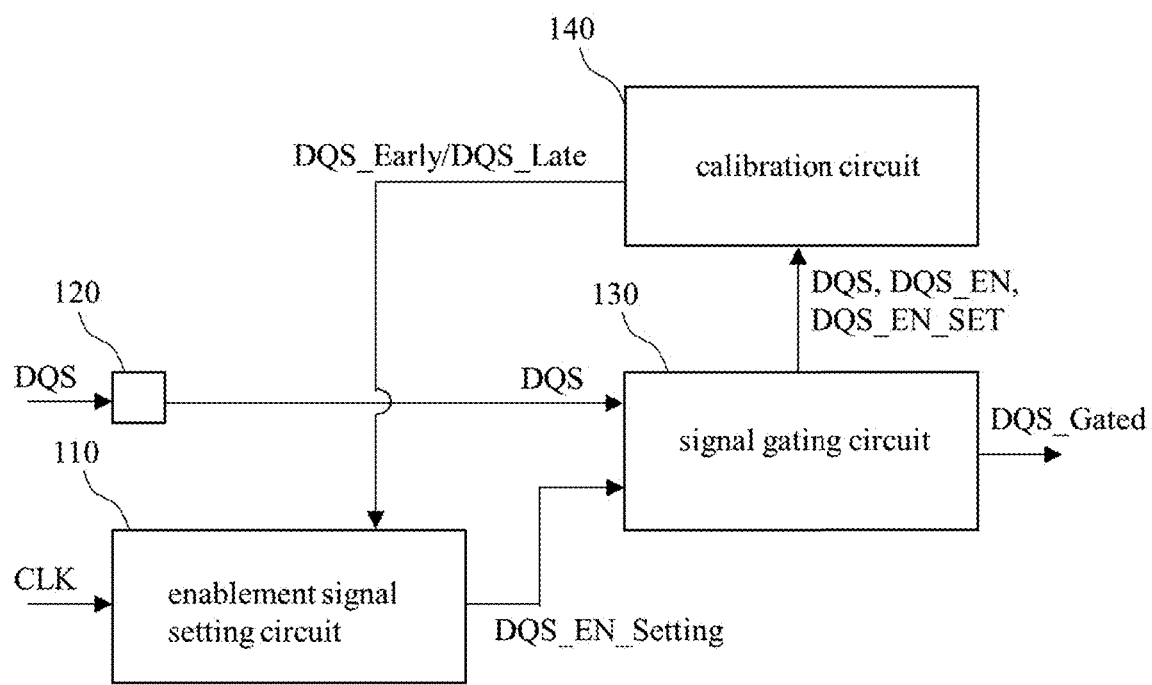
FIG. 1 shows an embodiment of the DDR SDRAM signal calibration device of the present invention.

FIG. 1 shows an embodiment of the DDR SDRAM signal calibration device of the present invention. The DDR SDRAM signal calibration device 100 of FIG. 1 includes an enablement signal setting circuit 110, a signal pad 120, a signal gating circuit 130, and a calibration circuit 140.

Please refer to FIG. 1. The enablement signal setting circuit 110 is configured to generate data strobe (DQS) enablement setting (DQS_EN_Setting) according to a reference clock (CLK). An embodiment of the enablement signal setting circuit 110 including a coarse tuning clock edge selector and a fine tuning delay chain controller is found in Applicant's U.S. patent application (application Ser. No. 16/177,603).

Figure 2:
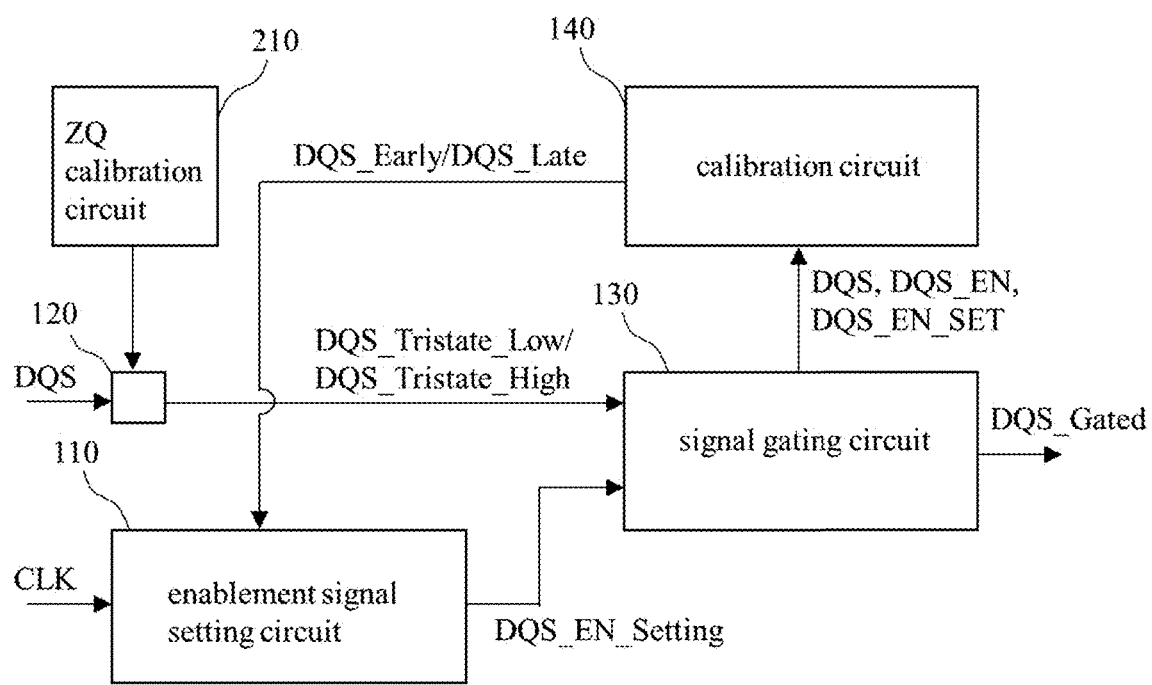
FIG. 2 shows the embodiment of FIG. 1 with a terminal impedance calibration circuit.

Please refer to FIG. 1. The signal pad 120 is configured to output a DQS signal (DQS). A conventional DQS signal includes a tristate, a preamble, and clocks. A known or self-developed terminal impedance calibration circuit (ZQ calibration circuit) 210 as shown in FIG. 2 is optionally coupled to the signal pad 120 and capable of adjusting a signal level of the tristate of the DQS signal; for instance, the terminal impedance calibration circuit 210 can optionally pull down or pull up the signal level of the tristate of the DQS signal (DQS_Tristate_Low/DQS_Tristate_High).

Please refer to FIG. 1. The signal gating circuit 130 is coupled to the enablement signal setting circuit 110 and the signal pad 120, and the signal gating circuit 130 is configured to generate a DQS enablement setting signal (DQS_EN_SET) and a DQS enablement signal (DQS_EN) according to the DQS enablement setting and then output a gated DQS signal (DQS_Gated) according to the DQS enablement signal and the DQS signal. For instance, the signal gating circuit 130 generates the DQS enablement setting signal according to the DQS enablement setting, then determines the timing of the DQS enablement signal changing from a low level to a high level according to the DQS enablement setting signal, and then performs an logical AND operation to the DQS enablement signal and the DQS signal in order to output the gated DQS signal. An embodiment of determining the timing of the DQS enablement signal changing from the low level to the high level and generating the gated DQS signal according to the DQS enablement signal is found in Applicant's U.S. patent application (application Ser. No. 16/177,603).

Please refer to FIG. 1. The calibration circuit 140 is coupled to the enablement signal setting circuit 110, and configured to output a calibration signal according to the DQS enablement setting signal and at least one of the DQS enablement signal and the DQS signal so that the enablement signal setting circuit 110 is allowed to maintain or adjust the DQS enablement setting according to the calibration signal.

Figure 3:
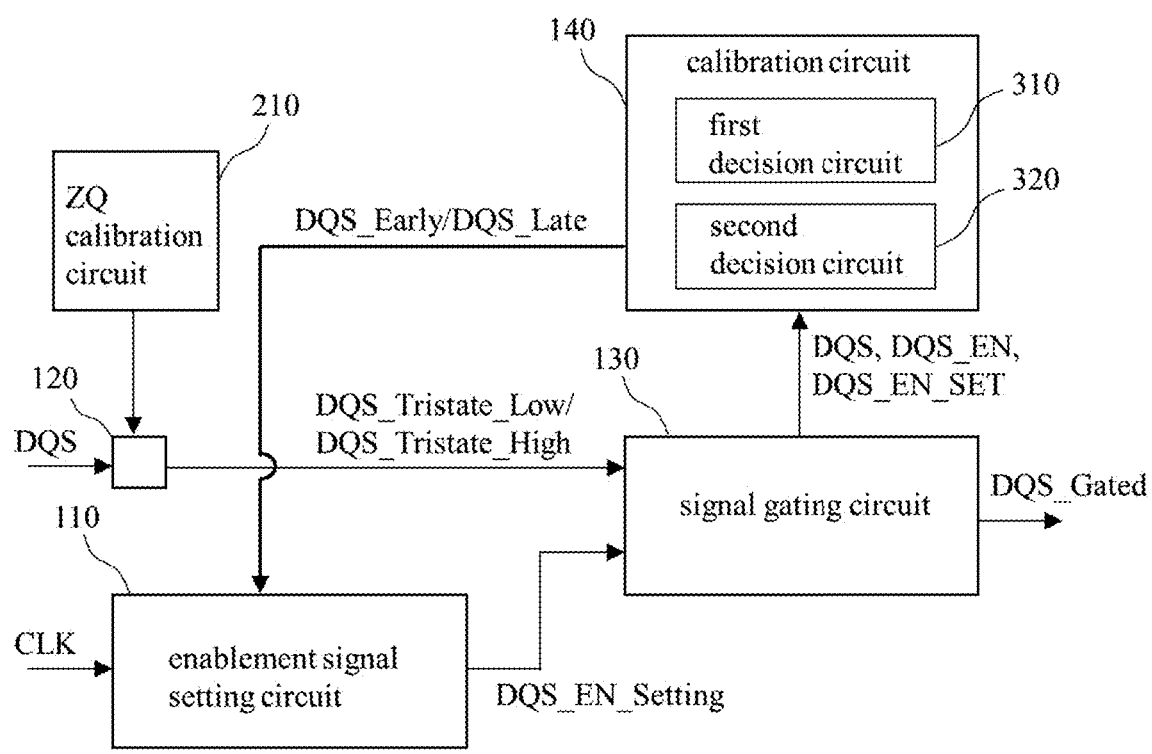
FIG. 3 shows an embodiment of the calibration circuit of FIG. 1.

In an exemplary implementation, the tristate of the DQS signal is pulled to a first level (e.g., low level); the calibration circuit 140 is configured to generate a first calibration signal (DQS_Early) of the calibration signal according to the DQS enablement signal and the DQS enablement setting signal, and generate a second calibration signal (DQS_Late) of the calibration signal according to the DQS signal and the DQS enablement setting signal; accordingly, the enablement signal setting circuit 110 can maintain or adjust the DQS enablement setting according to the first calibration signal and the second calibration signal. In this implementation, the calibration circuit 140 includes a first decision circuit 310 and a second decision circuit 320 as shown in FIG. 3. The first decision circuit 310 is configured to generate the first calibration signal according to a delay signal of the DQS enablement signal and the DQS enablement setting signal; and the second decision circuit 320 is configured to generate the second calibration signal according to the DQS signal and a delay signal of the DQS enablement setting signal.

Figure 4:
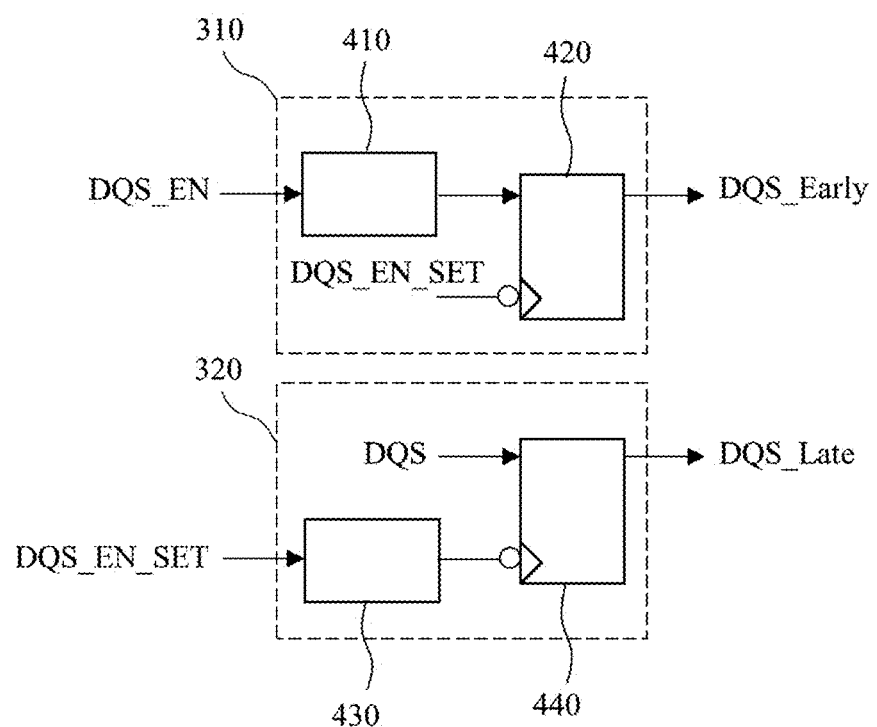
FIG. 4 shows an embodiment of the first and second decision circuits of FIG. 3.

FIG. 4 shows an embodiment of the first decision circuit 310 and the second decision circuit 320 of FIG. 3. As shown in FIG. 4, the first decision circuit 310 includes: a first delay circuit 410 configured to delay the DQS enablement signal in order to generate the delay signal of the DQS enablement signal; and a first storage circuit 420 (e.g., D-type flip flop) configured to sample and output the delay signal of the DQS enablement signal as the first calibration signal in accordance with a trigger of the DQS enablement setting signal. The second decision circuit 320 includes: a second delay circuit 430 configured to delay the DQS enablement setting signal in order to generate the delay signal of the DQS enablement setting signal; and a second storage circuit 440 (e.g., D-type flip flop) configured to sample and output the DQS signal as the second calibration signal in accordance with a trigger of the delay signal of the DQS enablement setting signal. Each of the delay circuits of FIG. 4 is a known or self-developed delay circuit; and each of the storage circuits of FIG. 4 is a known or self-developed circuit such as a D-type flip flop.

Figure 5:
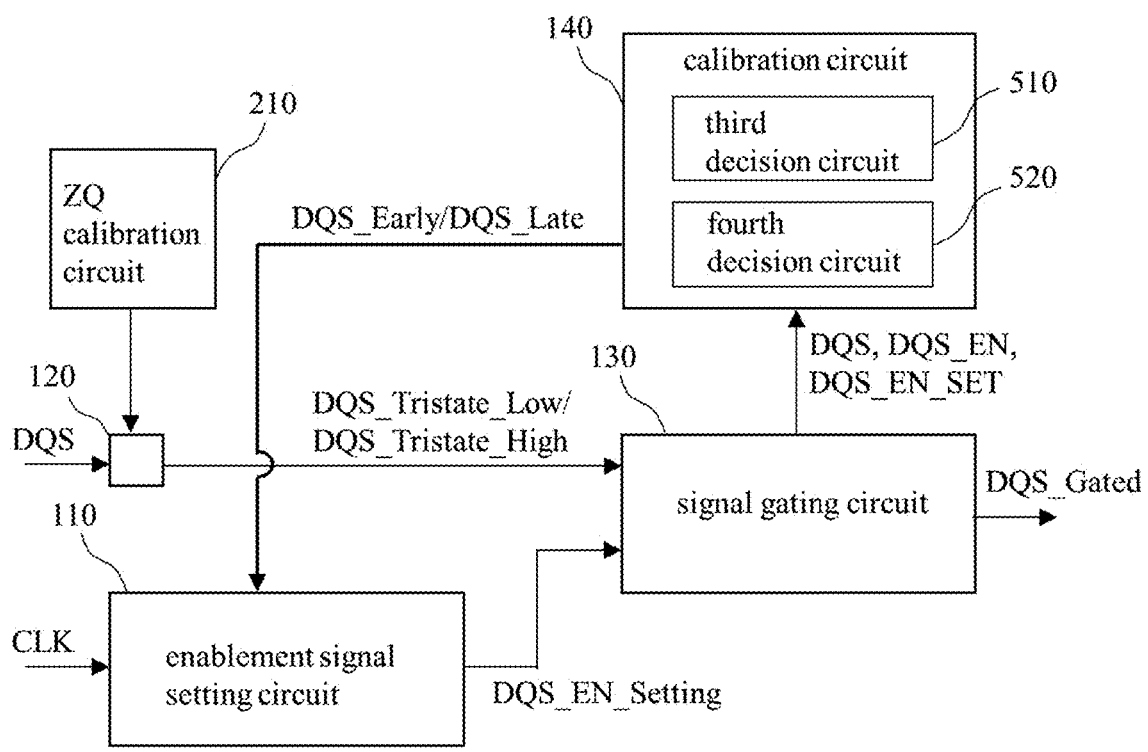
FIG. 5 shows an embodiment of the calibration circuit of FIG. 1.

In an exemplary implementation, the tristate of the DQS signal is pulled to a second level (e.g., high level); the calibration circuit 140 is configured to generate a first calibration signal and a second calibration signal of the calibration signal according to the DQS signal and the DQS enablement setting signal, and thereby the enablement signal setting circuit 110 maintains or adjusts the DQS enablement setting according to the first calibration signal and the second calibration signal. In this implementation, the calibration circuit 140 includes a third decision circuit 510 and a fourth decision circuit 520 as shown in FIG. 5. The third decision circuit 510 is configured to generate the first calibration signal according to a delay signal of the DQS signal and the DQS enablement setting signal; and the fourth decision circuit 520 is configured to generate the second calibration signal according to the DQS signal and a delay signal of the DQS enablement setting signal. It should be noted that since the tristate of the DQS signal can't be pulled up and down at the same time and the operation of the second decision circuit 320 is similar/identical to the operation of the fourth decision circuit 520, the second decision circuit 320 can be optionally used as the fourth decision circuit 520 when the calibration circuit 140 incorporates the circuit of FIG. 3 with the circuit of FIG. 5.

Figure 6:
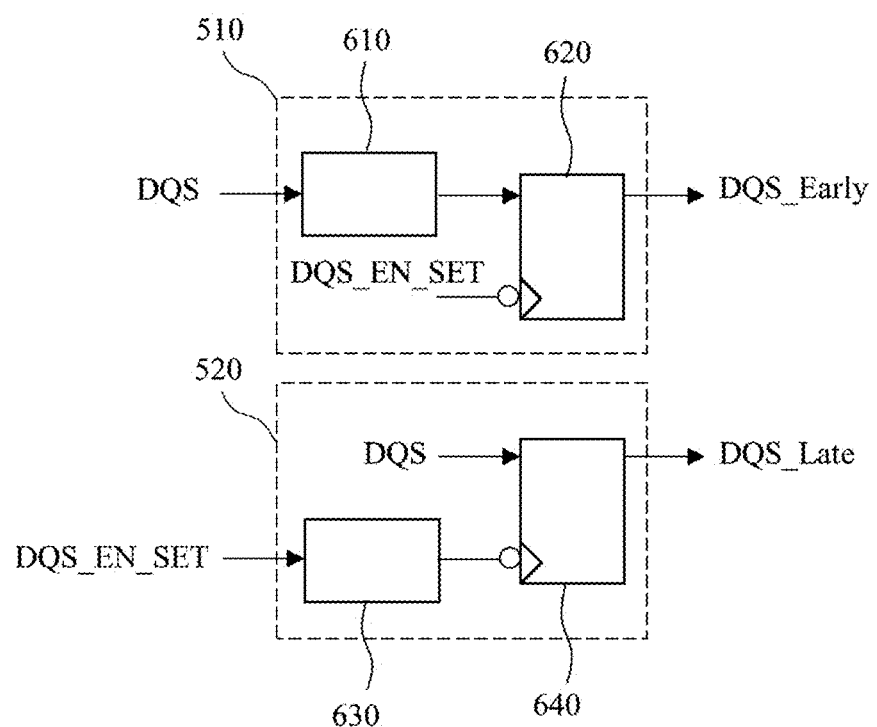
FIG. 6 shows an embodiment of the third and fourth decision circuits of FIG. 5.

FIG. 6 shows an embodiment of the third decision circuit 510 and the fourth decision circuit 520. As shown in FIG. 5, the third decision circuit 510 includes: a third delay circuit 610 configured to delay the DQS signal in order to generate the delay signal of the DQS signal; and a third storage circuit 620 configured to sample and output the delay signal of the DQS signal as the first calibration signal in accordance with a trigger of the DQS enablement setting signal. The fourth decision circuit 520 includes: a fourth delay circuit 630 configured to delay the DQS enablement setting signal in order to generate the delay signal of the DQS enablement setting signal; and a fourth storage circuit 640 configured to sample and output the DQS signal as the second calibration signal in accordance with a trigger of the delay signal of the DQS enablement setting signal. Each of the delay circuits of FIG. 6 is a known or self-developed delay circuit; and each of the storage circuits of FIG. 4 is a known or self-developed storage circuit such as a D-type flip flop.

Please refer to FIGS. 1-6. In an exemplary implementation, when the level of the first calibration signal is a first predetermined level (e.g., high level), it implies that the phase of the DQS signal falls behind and thus the enablement signal setting circuit 110 adjusts the DQS enablement setting according to the first calibration signal; and when the level of the second calibration signal is a second predetermined level (e.g., high level), it implies that the phase of the DQS signal takes the lead and thus the enablement signal setting circuit 110 adjusts the DQS enablement setting according to the second calibration signal, in which the first predetermined level can be the same as or different from the second predetermined level in accordance with the demand for implementation. In this implementation, when the level of the first calibration signal is the first predetermined level and the level of the second calibration signal is the second predetermined level at the same time, the calibration circuit 140 determines that the setting of the calibration circuit 140 is erroneous, and then the calibration circuit 140 redetermines the delay amount of at least one of the first delay circuit 410 and the second delay circuit 430 when the tristate of the DQS signal is pulled down, or redetermines the delay amount of at least one of the third delay circuit 610 and the fourth delay circuit 630 when the tristate of the DQS signal is pulled up.

Please refer to FIGS. 1-6. In an exemplary implementation, if the enablement signal setting circuit 110 adjusts the DQS enablement setting according to the first calibration signal indicating the phase of the DQS signal falling behind, the signal gating circuit 130 delays the DQS enablement signal for a first change amount (e.g., one half of the preamble of the DQS signal) according to the DQS enablement setting, in which the first change amount is between one and three quarters of a length of the preamble of the DQS signal; and if the enablement signal setting circuit 110 adjusts the DQS enablement setting according to the second calibration signal indicating the phase of the DQS signal taking the lead, the signal gating circuit 130 advances the DQS enablement signal for a second change amount (e.g., one half of the preamble of the DQS signal) according to the DQS enablement setting, in which the second change amount is between one and three quarters of the length of the preamble of the DQS signal. In an exemplary implementation, each of the first delay circuit 410, the second delay circuit 430, the third delay circuit 610, and the fourth delay circuit 630 causes a delay amount (e.g., one quarter of the preamble of the DQS signal) that is between one eighth and one half of a length of a preamble of the DQS signal. It should be noted that each of the above-mentioned first change amount, the second change amount, and the delay amount can be determined by those of ordinary skill in the art according to their demand for implementation.

Figure 7A:
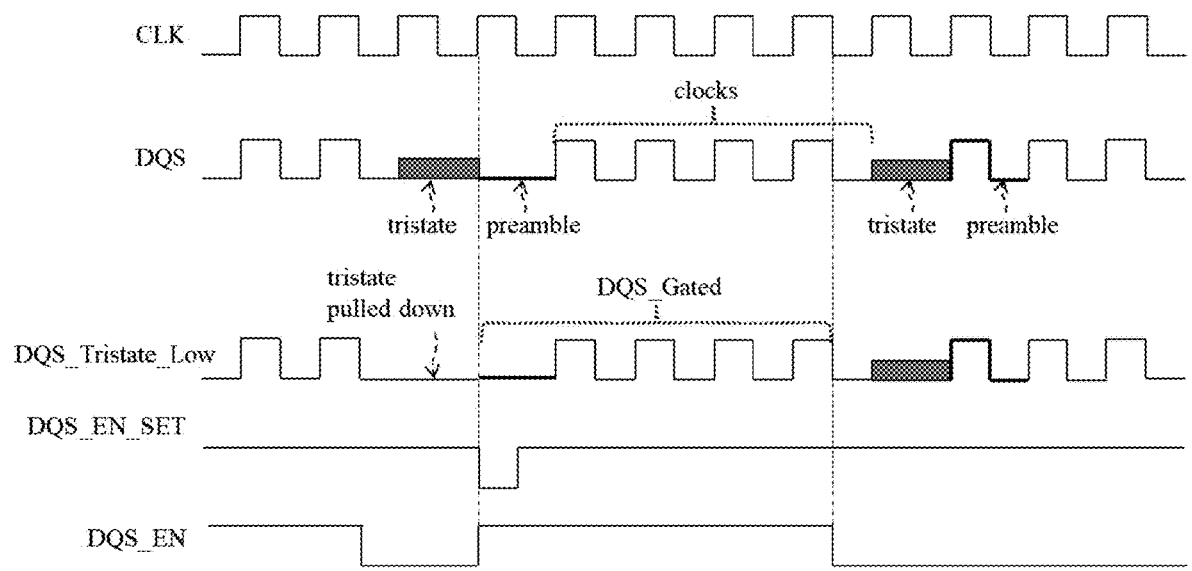
FIG. 7a-7c shows timing diagrams illustrating signal relations when the tristate of the DQS signal is pulled down.

FIG. 7a shows an exemplary timing diagram illustrating the ideal/initial relation between any two of the reference clock signal (CLK), the DQS signal (DQS), the DQS signal with the tristate being pulled down (DQS_Tristate_Low), the DQS enablement setting signal (DQS_EN_SET), and the DQS enablement signal (DQS_EN). In FIG. 7a, it is shown that the tristate and preamble of the DQS signal is treated as a longer preamble, the level change position of the DQS enablement setting signal is aligned with a predetermined position (e.g., the middle) of the longer preamble, and the DQS enablement signal (DQS_EN) is pulled up as the DQS enablement setting signal is pulled down.

Figure 7B:
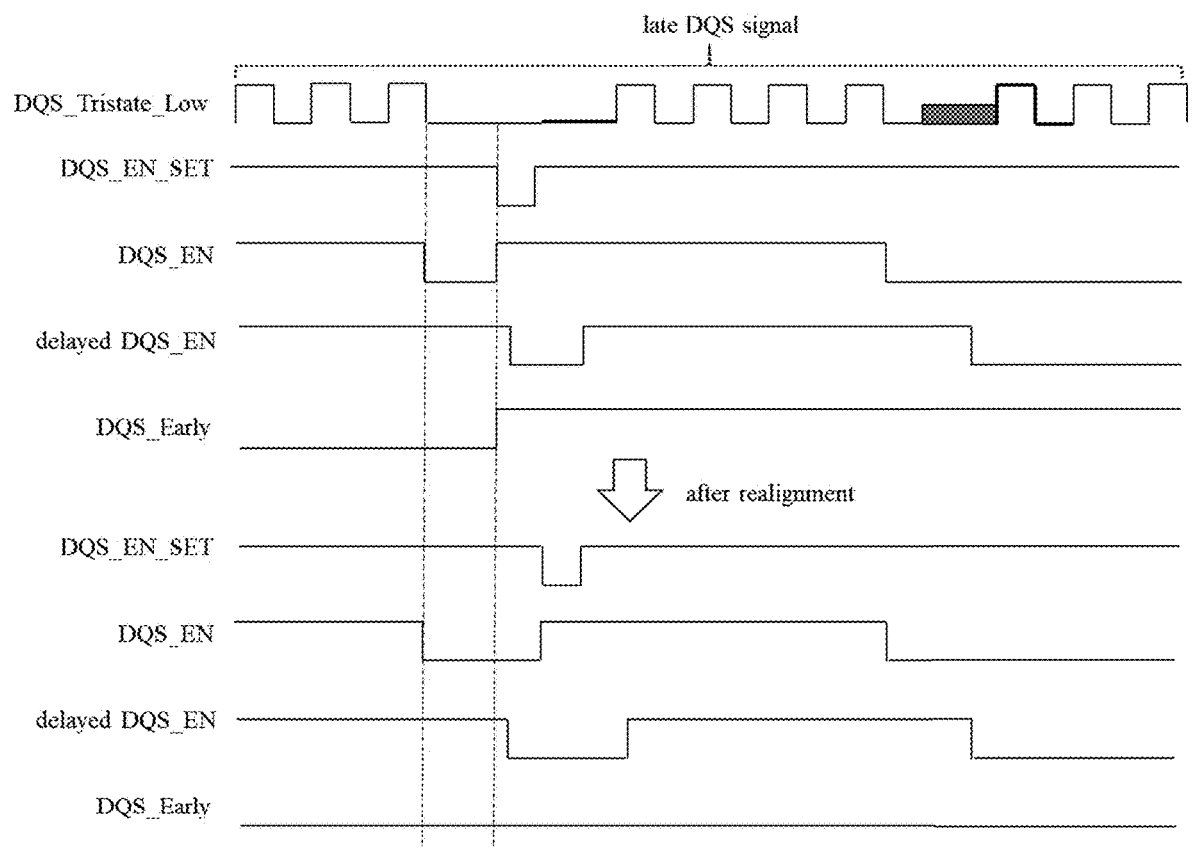

FIG. 7b shows an exemplary timing diagram illustrating the relation between any two of the DQS signal with the tristate being pulled down (DQS_Tristate_Low), the DQS enablement setting signal (DQS_EN_SET), the DQS enablement signal (DQS_EN), the delay signal of the DQS enablement signal (delayed DQS_EN), and the first calibration signal (DQS_Early) after the variation of voltage and/or temperature. In FIG. 7b, it is shown that the DQS signal (DQS_Tristate_Low) is late due to the influence of voltage and/or temperature and thus the high level of the delay signal of the DQS enablement signal (delayed DQS_EN) is sampled and outputted as the first calibration signal based on the trigger of the DQS enablement setting signal (DQS_EN_SET) with the first decision circuit 310 of FIG. 4; as a result, the first calibration signal (DQS_Early) is at the high level, consequently the DQS enablement setting signal (DQS_EN_SET) should be delayed to be realigned with the DQS signal (DQS_Tristate_Low), and this delay operation is executed by the enablement signal setting circuit 110 according to the first calibration signal and executed by the signal gating circuit 130 according to the updated DQS enablement setting. FIG. 7b also shows an exemplary timing diagram illustrating the relation between any two of the DQS enablement setting signal (DQS_EN_SET), the DQS enablement signal (DQS_EN), the delay signal of the DQS enablement signal (delayed DQS_EN), and the first calibration signal (DQS_Early) after the level change position of the DQS enablement setting signal is substantially/approximately realigned with the predetermined position (e.g., the middle) of the longer preamble of the DQS signal.

Figure 7C:
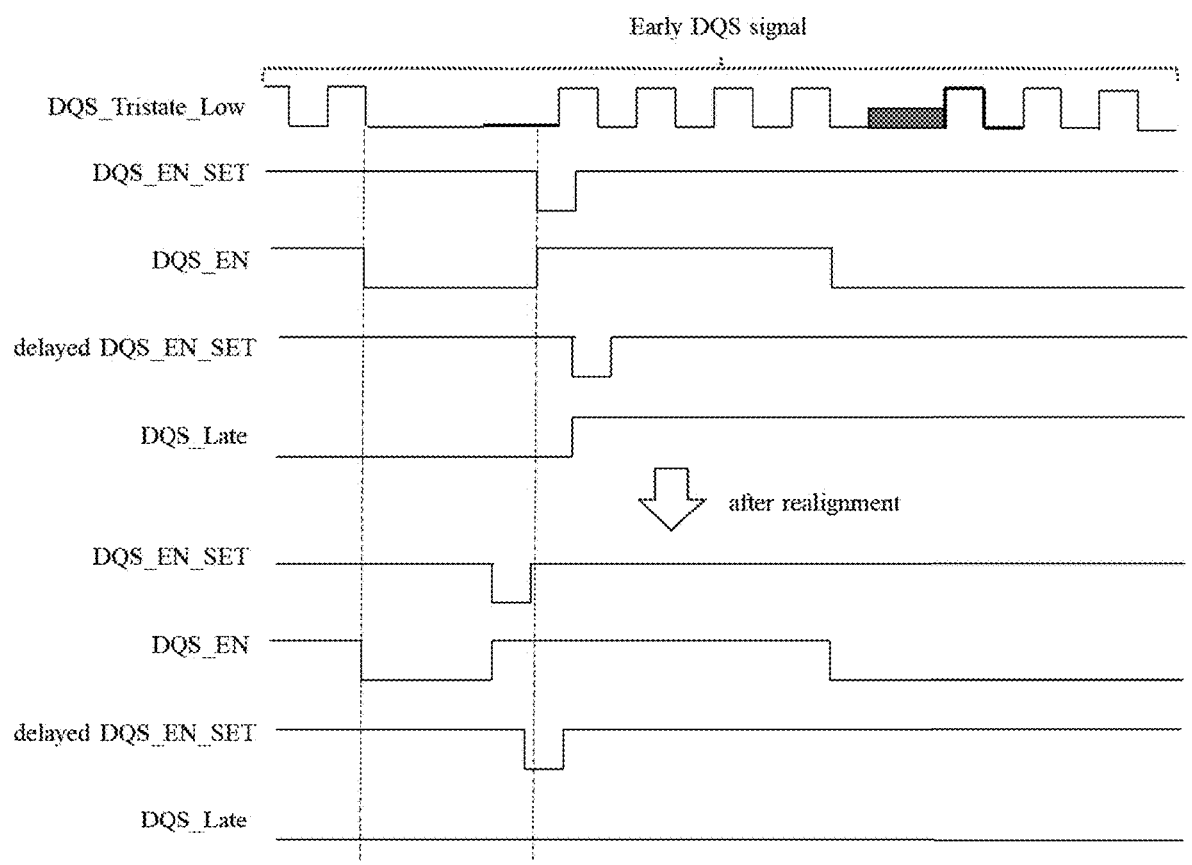

FIG. 7c shows an exemplary timing diagram illustrating the relation between any two of the DQS signal with the tristate being pulled down (DQS_Tristate_Low), the DQS enablement setting signal (DQS_EN_SET), the DQS enablement signal (DQS_EN), the delay signal of the DQS enablement setting signal (delayed DQS_EN_SET), and the first calibration signal (DQS_Early) after the variation of voltage and/or temperature. In FIG. 7c, it is shown that the DQS signal (DQS_Tristate_Low) is early due to the influence of voltage and/or temperature and thus the high level of the DQS signal (DQS) is sampled and outputted as the second calibration signal based on the trigger of the delay signal of the DQS enablement setting signal (delayed DQS_EN_SET) with the second decision circuit 320 of FIG. 4; as a result, the second calibration signal (DQS_Late) is at the high level, consequently the DQS enablement setting signal (DQS_EN_SET) should be advanced to be realigned with the DQS signal (DQS_Tristate_Low), and this delay operation is executed by the enablement signal setting circuit 110 according to the second calibration signal and executed by the signal gating circuit 130 according to the updated DQS enablement setting. FIG. 7c also shows an exemplary timing diagram illustrating the relation between any two of the DQS enablement setting signal (DQS_EN_SET), the DQS enablement signal (DQS_EN), the delay signal of the DQS enablement setting signal (delayed DQS_EN_SET), and the second calibration signal (DQS_Late) after the level change position of the DQS enablement setting signal (DQS_EN_SET) is substantially/approximately realigned with the predetermined position (e.g., the middle) of the longer preamble of the DQS signal.

Figure 8A:
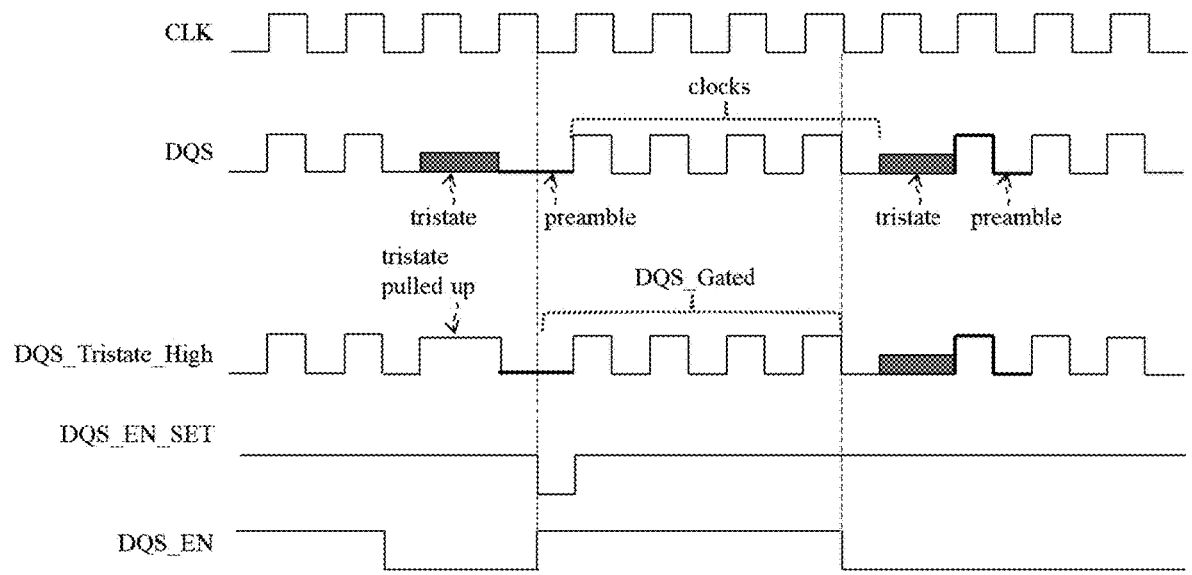
FIG. 8a-8c shows timing diagrams illustrating signal relations when the tristate of the DQS signal is pulled up.
Figure 8B:
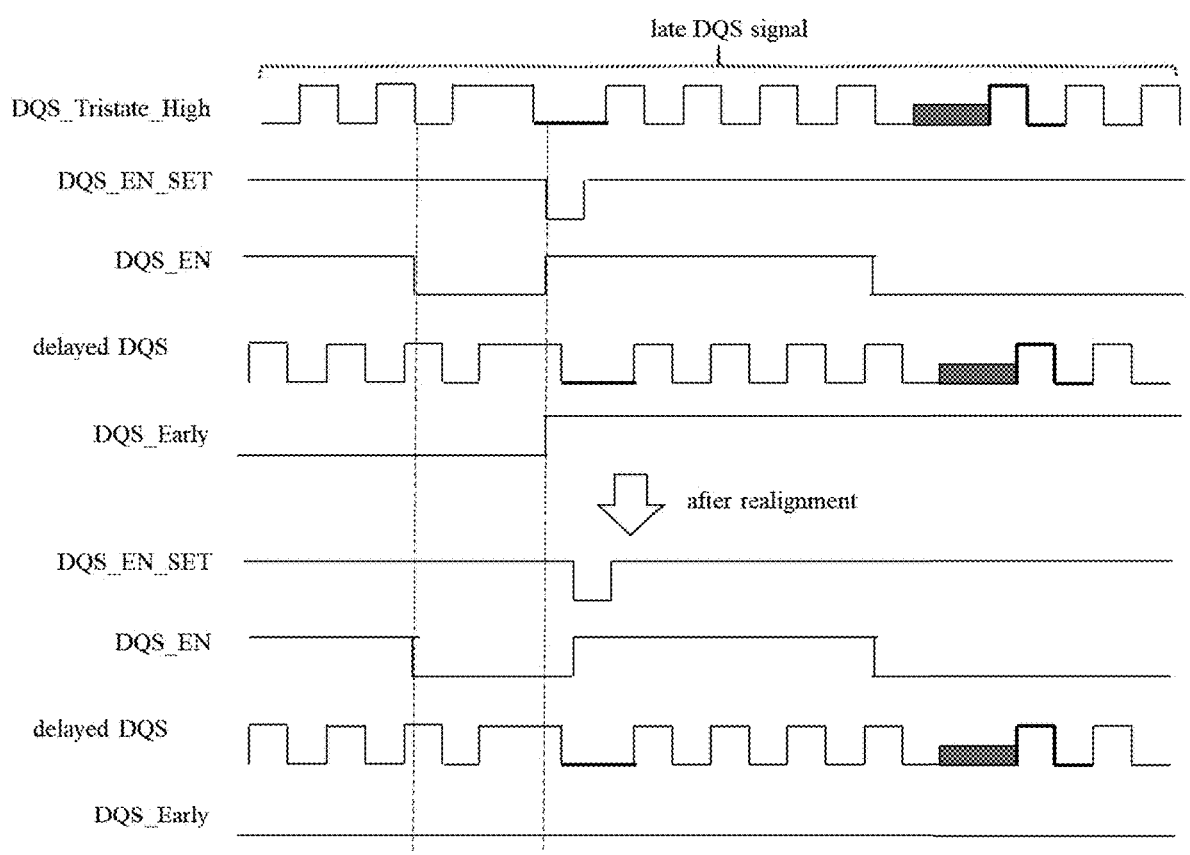
Figure 8C:
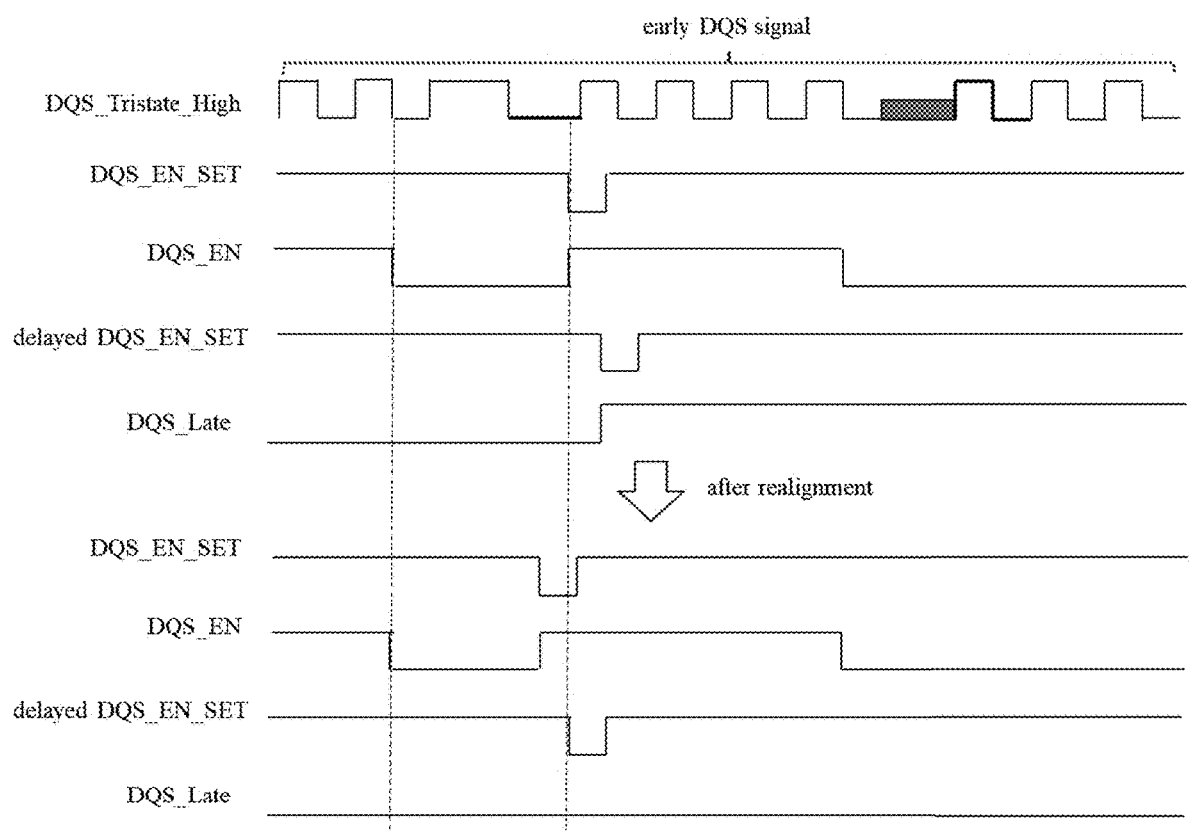

FIGS. 8a-8c shows exemplary timing diagrams illustrating the signal relations for the reference clock signal (CLK), the DQS signal (DQS), the DQS signal with the tristate being pulled up (DQS_Tristate_High), the DQS enablement setting signal (DQS_EN_SET), the DQS enablement signal (DQS_EN), the delay signal of the DQS signal (delayed DQS), the delay signal of the DQS enablement setting signal (delayed DQS_EN_SET), the first calibration signal (DQS_Early), and the second calibration signal (DQS_Late). In comparison with the illustration of FIGS. 7a-7c, the illustration of FIGS. 8a-8c is based on the tristate of the DQS signal is pulled up while the first and second calibration signals of FIGS. 8a-8c are generated with the third decision circuit 510 and the fourth decision circuit 520 of FIG. 6 respectively. Since those of ordinary skill in the art can understand FIGS. 8a-8c in accordance with the description of FIGS. 7a-7c and the disclosure of FIG. 6, repeated and redundant description is omitted here.

Figure 9:
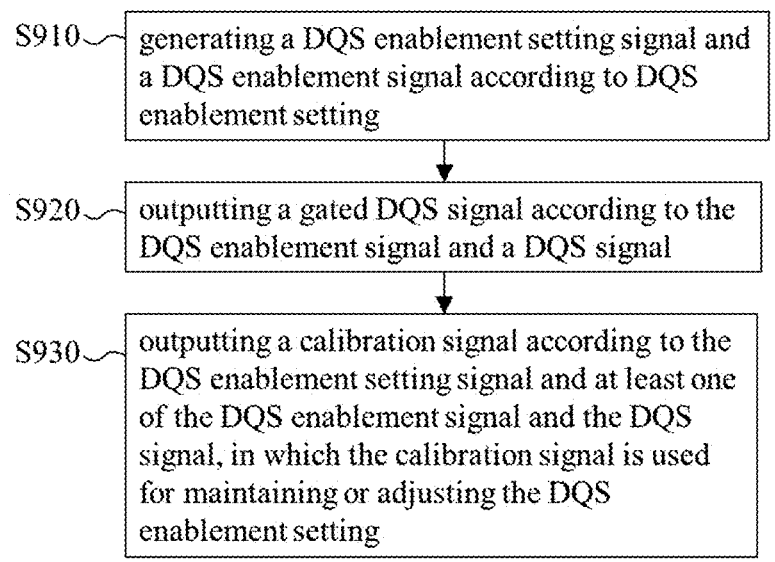
FIG. 9 shows an embodiment of the DDR SDRAM signal calibration method of the present invention.

FIG. 9 shows an embodiment of the DDR SDRAM signal calibration method of the present invention including the following steps:

step S910: generating a DQS enablement setting signal and a DQS enablement signal according to DQS enablement setting. This step can be executed by the signal gating circuit 130 of FIG. 1.

step S920: outputting a gated DQS signal according to the DQS enablement signal and a DQS signal. This step can be executed by the signal gating circuit 130 of FIG. 1.

step S930: outputting a calibration signal according to the DQS enablement setting signal and at least one of the DQS enablement signal and the DQS signal, in which the calibration signal is used for maintaining or adjusting the DQS enablement setting. This step can be executed by the calibration circuit 140 of FIG. 1.

Since those of ordinary skill in the art can appreciate the detail and the modification of the embodiment of FIG. 9 by referring to the disclosure of the embodiments of FIGS. 1-8c, repeated and redundant description is omitted here.

It should be noted that people of ordinary skill in the art can implement the present invention by selectively using some or all of the features of any embodiment in this specification or selectively using some or all of the features of multiple embodiments in this specification as long as such implementation is practicable, which implies that the present invention can be carried out flexibly.

To sum up, the DDR SDRAM signal calibration device and method of the present invention can adapt to the variation of voltage and/or temperature in an uncomplicated and cost-effective way.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A device comprising:
an enablement signal setting circuit configured to generate data strobe (DQS) enablement setting;
a signal pad configured to output a DQS signal;
a signal gating circuit coupled to the enablement signal setting circuit and the signal pad and configured to generate a DQS enablement setting signal and a DQS enablement signal according to the DQS enablement setting, the signal gating circuit outputting a gated DQS signal according to the DQS enablement signal and the DQS signal; and
a calibration circuit coupled to the enablement signal setting circuit and the signal gating circuit and configured to output a calibration signal according to the DQS enablement setting signal and at least one of the DQS enablement signal and the DQS signal, wherein the enablement signal setting circuit maintains or adjusts the DQS enablement setting according to the calibration signal.

2. The device of claim 1, further comprising: a terminal impedance calibration circuit, coupled to the signal pad, capable of adjusting a signal level of a tristate of the DQS signal.

3. The device of claim 2, wherein when the signal level is a first level, the calibration circuit is configured to generate a first calibration signal of the calibration signal according to the DQS enablement signal and the DQS enablement setting signal and generate a second calibration signal of the calibration signal according to the DQS signal and the DQS enablement setting signal, and thereby the enablement signal setting circuit maintains or adjusts the DQS enablement setting according to the first calibration signal and the second calibration signal.

4. The device of claim 3, wherein if the enablement signal setting circuit adjusts the DQS enablement setting according to the first calibration signal, the signal gating circuit delays the DQS enablement signal for a first change amount according to the DQS enablement setting, in which the first change amount is between one and three quarters of a length of a preamble of the DQS signal; and if the enablement signal setting circuit adjusts the DQS enablement setting according to the second calibration signal, the signal gating circuit advances the DQS enablement signal for a second change amount according to the DQS enablement setting, in which the second change amount is between one and three quarters of the length of the preamble of the DQS signal.

5. The device of claim 3, wherein the calibration circuit includes:
a first decision circuit configured to generate the first calibration signal according to a delay signal of the DQS enablement signal and the DQS enablement setting signal when the signal level is the first level; and
a second decision circuit configured to generate the second calibration signal according to the DQS signal and a delay signal of the DQS enablement setting signal when the signal level is the first level.

6. The device of claim 5, wherein the first decision circuit includes:
a first delay circuit configured to delay the DQS enablement signal in order to generate the delay signal of the DQS enablement signal when the signal level is the first level; and
a first storage circuit configured to sample and output the delay signal of the DQS enablement signal as the first calibration signal in accordance with a trigger of the DQS enablement setting signal when the signal level is the first level; and
the second decision circuit includes:
a second delay circuit configured to delay the DQS enablement setting signal in order to generate the delay signal of the DQS enablement setting signal when the signal level is the first level; and
a second storage circuit configured to sample and output the DQS signal as the second calibration signal in accordance with a trigger of the delay signal of the DQS enablement setting signal when the signal level is the first level.

7. The device of claim 6, wherein each of the first delay circuit and the second delay circuit causes a delay amount that is between one eighth and one half of a length of a preamble of the DQS signal.

8. The device of claim 6, wherein when a level of the first calibration signal is a first predetermined level, the enablement signal setting circuit adjusts the DQS enablement setting according to the first calibration signal; and when a level of the second calibration signal is a second predetermined level, the enablement signal setting circuit adjusts the DQS enablement setting according to the second calibration signal, in which the first predetermined level is the same as or different from the second predetermined level.

9. The device of claim 8, wherein when the level of the first calibration signal is the first predetermined level and the level of the second calibration signal is the second predetermined level, the calibration circuit redetermines a delay amount of at least one of the first delay circuit and the second delay circuit.

10. The device of claim 2, wherein when the signal level is a second level, the calibration circuit is configured to generate a first calibration signal and a second calibration signal of the calibration signal according to the DQS signal and the DQS enablement setting signal, and thereby the enablement signal setting circuit maintains or adjusts the DQS enablement setting according to the first calibration signal and the second calibration signal.

11. The device of claim 10, wherein if the enablement signal setting circuit adjusts the DQS enablement setting according to the first calibration signal, the signal gating circuit delays the DQS enablement signal for a first change amount according to the DQS enablement setting, in which the first change amount is between one and three quarters of a length of a preamble of the DQS signal; and if the enablement signal setting circuit adjusts the DQS enablement setting according to the second calibration signal, the signal gating circuit advances the DQS enablement signal for a second change amount according to the DQS enablement setting, in which the second change amount is between one and three quarters of the length of the preamble of the DQS signal.

12. The device of claim 10, wherein the calibration circuit includes:
   a third decision circuit configured to generate the first calibration signal according to a delay signal of the DQS signal and the DQS enablement setting signal when the signal level is the second level; and
   a fourth decision circuit configured to generate the second calibration signal according to the DQS signal and a delay signal of the DQS enablement setting signal when the signal level is the second level.

13. The device of claim 12, wherein the third decision circuit includes:
   a third delay circuit configured to delay the DQS signal in order to generate the delay signal of the DQS signal when the signal level is the second level; and
   a third storage circuit configured to sample and output the delay signal of the DQS signal as the first calibration signal in accordance with a trigger of the DQS enablement setting signal when the signal level is the second level; and
the fourth decision circuit includes:
   a fourth delay circuit configured to delay the DQS enablement setting signal in order to generate the delay signal of the DQS enablement setting signal when the signal level is the second level; and
   a fourth storage circuit configured to sample and output the DQS signal as the second calibration signal in accordance with a trigger of the delay signal of the DQS enablement setting signal when the signal level is the second level.

14. The device of claim 13, wherein each of the third delay circuit and the fourth delay circuit causes a delay amount that is between one eighth and one half of a length of a preamble of the DQS signal.

15. The device of claim 13, wherein when a level of the first calibration signal is a first predetermined level, the enablement signal setting circuit adjusts the DQS enablement setting according to the first calibration signal; and when a level of the second calibration signal is a second predetermined level, the enablement signal setting circuit adjusts the DQS enablement setting according to the second calibration signal, in which the first predetermined level is the same as or different from the second predetermined level.

16. The device of claim 15, wherein when the level of the first calibration signal is the first predetermined level and the level of the second calibration signal is the second predetermined level, the calibration circuit redetermines a delay amount of at least one of the first delay circuit and the second delay circuit.

17. A method comprising:
   generating a DQS enablement setting signal and a DQS enablement signal according to DQS enablement setting;
   outputting a gated DQS signal according to the DQS enablement signal and a DQS signal; and
   outputting a calibration signal according to the DQS enablement setting signal and at least one of the DQS enablement signal and the DQS signal, wherein the calibration signal is used to maintain or adjust the DQS enablement setting.

18. The method of claim 17, further comprising: adjusting a signal level of a tristate of the DQS signal.

19. The method of claim 18, further comprising a step of maintaining or adjusting the DQS enablement signal, the step including:
   generating a first calibration signal of the calibration signal according to the DQS enablement signal and the DQS enablement setting signal and generating a second calibration signal of the calibration signal according to the DQS signal and the DQS enablement setting signal when the signal level is a first level, and thereby maintaining or adjusting the DQS enablement setting according to the first calibration signal and the second calibration signal.

20. The method of claim 18, further comprising a step of maintaining or adjusting the DQS enablement signal, the step including:
   generating a first calibration signal and a second calibration signal of the calibration signal according to the DQS signal and the DQS enablement setting signal when the signal level is a second level, and thereby maintaining or adjusting the DQS enablement setting according to the first calibration signal and the second calibration signal.

* * * * *